US011527697B2

(12) United States Patent
Shao et al.

(10) Patent No.: US 11,527,697 B2
(45) Date of Patent: Dec. 13, 2022

(54) QUBIT FREQUENCY TUNING STRUCTURES AND FABRICATION METHODS FOR FLIP CHIP QUANTUM COMPUTING DEVICES

(71) Applicant: International Business Machines Corporation, Armonk, NY (US)

(72) Inventors: Dongbing Shao, Wappingers Falls, NY (US); Markus Brink, White Plains, NY (US); Firat Solgun, Ossining, NY (US); Jared Barney Hertzberg, Yorktown Heights, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 246 days.

(21) Appl. No.: 17/110,836

(22) Filed: Dec. 3, 2020

(65) Prior Publication Data

US 2021/0091295 A1   Mar. 25, 2021

Related U.S. Application Data

(63) Continuation of application No. 16/389,001, filed on Apr. 19, 2019, now Pat. No. 10,903,412.

(51) Int. Cl.
| | |
|---|---|
| H01L 39/22 | (2006.01) |
| H01L 39/24 | (2006.01) |
| G06N 10/00 | (2022.01) |

(52) U.S. Cl.
CPC ........... *H01L 39/223* (2013.01); *G06N 10/00* (2019.01); *H01L 39/2406* (2013.01); *H01L 39/2416* (2013.01)

(58) Field of Classification Search
CPC ............... H01L 39/223; H01L 39/2406; H01L 39/2416; H01L 27/18; H01L 39/025; H01L 39/24; G06N 10/00
See application file for complete search history.

(56) References Cited

U.S. PATENT DOCUMENTS

| | | | |
|---|---|---|---|
| 10,068,181 B1 | 9/2018 | Rigetti et al. | |
| 2014/0264287 A1* | 9/2014 | Abraham | H01P 7/086 257/31 |
| 2018/0247974 A1* | 8/2018 | Oliver | H01L 39/045 |

OTHER PUBLICATIONS

Brink et al., "Device challenges for near term superconducting quantum processors: frequency collisions", 2018 IEEE International Electron Devices Meeting (IEDM), Dec. 1, 2018.
Application No. 2020259830, Examination report No. 1 for standard patent application, dated Aug. 31, 2022.
List of all IBM related dockets, 2020.

* cited by examiner

*Primary Examiner* — Yasser A Abdelaziez
(74) *Attorney, Agent, or Firm* — Garg Law Firm, PLLC; Rakesh Garg; Erik Johnson

(57) ABSTRACT

A quantum computing device includes a first chip having a first substrate and one or more qubits disposed on the first substrate. Each of the one or more qubits has an associated resonance frequency. The quantum computing device further includes a second chip having a second substrate and at least one conductive surface disposed on the second substrate opposite the one or more qubits. The at least one conductive surface has at least one dimension configured to adjust the resonance frequency associated with at least one of the one or more qubits to a determined frequency adjustment value.

20 Claims, 12 Drawing Sheets

QUBIT FREQUENCY TUNING STRUCTURES AND FABRICATION METHODS FOR FLIP CHIP QUANTUM COMPUTING DEVICES

TECHNICAL FIELD

The present invention relates generally to a superconductor device, a fabrication method, and fabrication system for tuning qubit frequencies in superconducting quantum devices. More particularly, the present invention relates to a device, method, and system for qubit frequency tuning structures and fabrication methods for flip chip quantum computing devices.

BACKGROUND

Hereinafter, a "Q" prefix in a word or phrase is indicative of a reference of that word or phrase in a quantum computing context unless expressly distinguished where used.

Molecules and subatomic particles follow the laws of quantum mechanics, a branch of physics that explores how the physical world works at a fundamental level. At this level, particles behave in strange ways, taking on more than one state at the same time, and interacting with other particles that are very far away. Quantum computing harnesses these quantum phenomena to process information.

The computers we use today are known as classical computers (also referred to herein as "conventional" computers or conventional nodes, or "CN"). A conventional computer uses a conventional processor fabricated using semiconductor materials and technology, a semiconductor memory, and a magnetic or solid-state storage device, in what is known as a Von Neumann architecture. Particularly, the processors in conventional computers are binary processors, i.e., operating on binary data represented in 1 and 0.

A quantum processor (q-processor) uses the odd nature of entangled qubit devices (compactly referred to herein as "qubit," plural "qubits") to perform computational tasks. In the particular realms where quantum mechanics operates, particles of matter can exist in multiple states—such as an "on" state, an "off" state, and both "on" and "off" states simultaneously. Where binary computing using semiconductor processors is limited to using just the on and off states (equivalent to 1 and 0 in binary code), a quantum processor harnesses these quantum states of matter to output signals that are usable in data computing.

Conventional computers encode information in bits. Each bit can take the value of 1 or 0. These 1s and 0s act as on/off switches that ultimately drive computer functions. Quantum computers, on the other hand, are based on qubits, which operate according to two key principles of quantum physics: superposition and entanglement. Superposition means that each qubit can represent both a 1 and a 0 at the same time. Entanglement means that qubits in a superposition can be correlated with each other in a non-classical way; that is, the state of one (whether it is a 1 or a 0 or both) can depend on the state of another, and that there is more information that can be ascertained about the two qubits when they are entangled than when they are treated individually.

Using these two principles, qubits operate as more sophisticated processors of information, enabling quantum computers to function in ways that allow them to solve difficult problems that are intractable using conventional computers. IBM has successfully constructed and demonstrated the operability of a quantum processor using superconducting qubits (IBM is a registered trademark of International Business Machines corporation in the United States and in other countries.)

A superconducting qubit includes a Josephson junction. A Josephson junction is a superconducting tunnel junction, which is formed by separating two thin-film superconducting metal layers by a non-superconducting material. When the metal in the superconducting layers is caused to become superconducting—e.g. by reducing the temperature of the metal to a specified cryogenic temperature—pairs of electrons can tunnel from one superconducting layer through the non-superconducting layer to the other superconducting layer. In a qubit, the Josephson junction—which functions as a dispersive nonlinear inductor—is electrically coupled in parallel with one or more capacitive devices forming a nonlinear microwave oscillator. The oscillator has a resonance/transition frequency determined by the value of the inductance and the capacitance in the qubit circuit. Any reference to the term "qubit" is a reference to a superconducting qubit circuitry that employs a Josephson junction, unless expressly distinguished where used.

In a superconducting state, the material firstly offers no resistance to the passage of electrical current. When resistance falls to zero, a current can circulate inside the material without any dissipation of energy. Secondly, the material exhibits the Meissner effect, i.e., provided they are sufficiently weak, external magnetic fields do not penetrate the superconductor, but remain at its surface. When one or both of these properties are no longer exhibited by the material, the material is said to be in a normal state and no longer superconducting.

A critical temperature of a superconducting material is a temperature at which the material begins to exhibit characteristics of superconductivity. Superconducting materials exhibit very low or zero resistivity to the flow of current. A critical field is the highest magnetic field, for a given temperature, under which a material remains superconducting.

Superconductors are generally classified into one of two types. Type I superconductors exhibit a single transition at the critical field. Type I superconductors transition from a non-superconducting state to a superconducting state when the critical field is reached. Type II superconductors include two critical fields and two transitions. At or below the lower critical field, type II superconductors exhibit a superconducting state. Above the upper critical field, type II superconductors exhibit no properties of superconductivity. Between the upper critical field and the lower critical field, type II superconductors exhibit a mixed state. In a mixed state, type II superconductors exhibit an incomplete Meissner effect, i.e., penetration of external magnetic fields in quantized packets at specific locations through the superconductor material.

The information processed by qubits is carried or transmitted in the form of microwave signals/photons in the range of microwave frequencies. The microwave signals are captured, processed, and analyzed to decipher the quantum information encoded therein. A readout circuit is a circuit coupled with the qubit to capture, read, and measure the quantum state of the qubit. An output of the readout circuit is information usable by a q-processor to perform computations.

A superconducting qubit has two quantum states—|0> and |1>. These two states may be two energy states of atoms, for example, the ground (|g>) and first excited (|e>) state of a superconducting artificial atom (superconducting qubit). Other examples include spin-up and spin-down of the nuclear or electronic spins, two positions of a crystalline defect, and two states of a quantum dot. Since the system is of a quantum nature, any combination of the two states are allowed and valid.

Superconducting devices such as qubits are fabricated using superconducting and semiconductor materials in known semiconductor fabrication techniques. A superconducting device generally uses one or more layers of different materials to implement the device properties and function. A layer of material can be superconductive, conductive, semiconductive, insulating, resistive, inductive, capacitive, or have any number of other properties. Different layers of materials may have to be formed using different methods, given the nature of the material, the shape, size or placement of the material, other materials adjacent to the material, and many other considerations.

Superconducting devices are often planar, i.e., where the superconductor structures are fabricated on one plane. A non-planar device is a three-dimensional (3D) device where some of the structures are formed above or below a given plane of fabrication.

Some qubits are fabricated using a flip chip geometry. In the flip chip geometry, a qubit chip (also referred to as a "Qchip") is fabricated having a number of individual qubits upon a substrate, and an interposer chip having one or more connections is fabricated on a separate substrate. Solder bumps are deposited onto chip pads on a first surface of the qubit chip and/or interposer chip, and the qubit chip or interposer chip is flipped over so that its first side faces down. The qubit chip and interposer chip are aligned and bump-bonded, so that the solder of the solder bumps complete the electrical connection of the qubit chip and the interposer chip.

The readout circuitry is generally coupled with a qubit by electromagnetic resonance (usually a microwave or radio-frequency resonance) using a resonator. A resonator in the readout circuitry comprises inductive and capacitive elements. Some qubits are fixed-frequency qubits, i.e., their resonance frequencies are not changeable. Other qubits are frequency-tunable qubits. A q-processor can employ fixed-frequency qubits, frequency-tunable qubits, or a combination thereof.

The illustrative embodiments recognize that a fixed-frequency qubit is designed to be fixed in frequency to improve immunity to noise. The illustrative embodiments recognize that when the resonance frequencies of two coupled qubits on a chip are the same or within a threshold band of frequencies, or their higher transition frequencies are on resonance or close to resonance, then negative effects can happen such as, crosstalk, quantum decoherence, energy decay, creation of mixed states, unintended information transfer, quantum state leakage and so on. The illustrative embodiments further recognize that such qubits can also negatively affect the performance or utility of certain quantum gates, such as cross-resonance gates which have stringent requirements on the spectrum of resonance frequencies of qubits upon which the gate is operating on. The illustrative embodiments further recognize that one challenge in quantum processors that are based on fixed-frequency qubits is frequency crowding or frequency collision between adjacent qubits.

The illustrative embodiments recognize that another challenge in quantum processors that are based on fixed-frequency qubits is low On/Off ratios between when microwave signals turn On an interaction (On interaction strength) and the interactions between coupled qubits when these signals are disabled (Off interaction strength). The illustrative embodiments further recognize that yet another challenge in quantum processors that are based on fixed-frequency qubits is enabling a gate of interest without producing unwanted interactions at other sites. The illustrative embodiments further recognize that imperfections in the fabrication and the materials used in the presently available fabrication methods for fixed-frequency qubits leads to deviations from an intended resonance frequency.

SUMMARY

The illustrative embodiments provide a superconducting device, and a method and system of fabrication therefor. An embodiment of a quantum computing device includes a first chip having a first substrate and one or more qubits disposed on the first substrate. In the embodiment, each of the one or more qubits have an associated resonance frequency. The embodiment further includes a second chip having a second substrate and at least one conductive surface disposed on the second substrate opposite the one or more qubits. In the embodiment, the at least one conductive surface has at least one dimension configured to adjust the resonance frequency associated with at least one of the one or more qubits to a determined frequency adjustment value.

In another embodiment, the at least one dimension of the conductive surface is based upon a measurement of a parameter associated with each of the one or more qubits.

In another embodiment, the resonance frequency associated with a particular qubit is a predicted resonance frequency calculated based upon the measured parameter.

In another embodiment, the parameter includes a resistance associated with the one or more qubits. In another embodiment, the resistance is a normal-state resistance of a junction of the qubit. In another embodiment, the junction is a Josephson junction of the qubit.

In another embodiment, the at least one dimension is determined based upon a capacitance change to achieve the frequency adjustment value. In another embodiment, the at least one dimension includes at least one of a shape or an area of the conducting surface.

In another embodiment, the frequency adjustment value is determined to mitigate a frequency collision between the resonance frequencies associated with the one or more qubits.

In another embodiment, the at least one conductive surface includes a ground plane. In another embodiment, the at least one conductive surface is formed of at least one of a superconductive material or a metal material.

In another embodiment, the first chip and the second chip are disposed in a flip chip arrangement. In another embodiment, the first chip and the second chip are coupled together at a predetermined distance based upon at least one of a frequency tuning range or a tuning sensitivity.

In another embodiment, the conductive surface is of at least one member selected from a set comprising Aluminum, Niobium, Titanium, Titanium Nitride, Palladium Silver, Copper, Platinum, and Gold. In another embodiment, the first substrate is of at least one member selected from a set comprising sapphire, silicon, quartz, gallium arsenide, fused silica, amorphous silicon, and diamond.

In another embodiment, the second substrate is of at least one member selected from a set comprising sapphire, silicon, quartz, gallium arsenide, fused silica, amorphous silicon, and diamond. In another embodiment, the conductive surface is a superconducting material. In another embodiment, the at least one dimension includes a depth of a recess formed in the second substrate.

In another embodiment, a quantum computing device includes a first chip having a first substrate and one or more qubits disposed on the first substrate, each of the one or more qubits having an associated resonance frequency. In the embodiment, the quantum computing device includes a second chip having a second substrate, the second substrate having a recess formed therein, wherein a depth of the recess corresponds to a desired resonance frequency associated with at least one of the one or more qubits. In another embodiment, the first substrate is of at least one member selected from a set comprising sapphire, silicon, quartz, gallium arsenide, fused silica, amorphous silicon, and diamond.

An embodiment includes a fabrication method for fabricating the quantum computing device. In an embodiment, the method includes depositing a first layer, wherein the at least one conductive surface comprises the first layer. In an embodiment, the method includes removing a portion of the first layer.

In an embodiment, the method includes depositing a second layer on the second substrate, wherein the at least one conductive surface comprises the second layer. In an embodiment, the first layer and the second layer are connected. In an embodiment, an open space on the second substrate is disposed between the first layer and the second layer. In an embodiment, a recess in the second substrate is disposed between the first layer and the second layer.

In an embodiment, the method includes removing a portion of the second substrate. In an embodiment, the at least one dimension is a depth of a recess formed in the second substrate. In an embodiment, the method includes etching the recess in the second substrate.

An embodiment includes a fabrication system for fabricating the quantum computing device.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of the illustrative embodiments when read in conjunction with the accompanying drawings, wherein:

DETAILED DESCRIPTION

The illustrative embodiments used to describe the invention generally address and solve the above-described problems and other related problems by providing qubit frequency tuning structures for flip chip quantum computing devices. The illustrative embodiments also provide a fabrication method and system for fabricating qubit frequency tuning structures for flip chip quantum computing devices.

Figure 1:
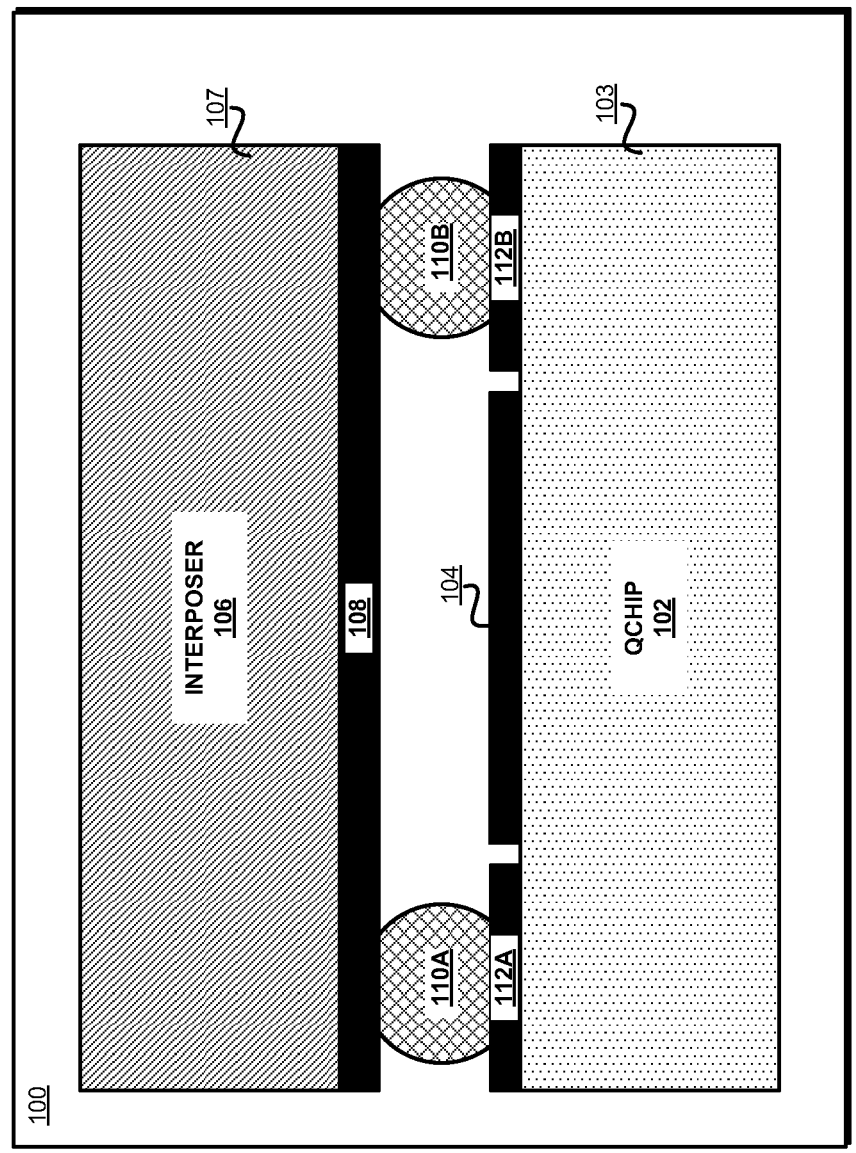
FIG. 1 depicts a cross-section view an example flip chip quantum computing device illustrating a problem that can be solved using an illustrative embodiment.

FIG. 1 depicts an example cross-section view of a flip chip quantum computing device 100 illustrating a problem that can be solved using an illustrative embodiment. Flip chip quantum computing device 100 includes a qubit chip 102 having a qubit substrate 103. Qubit substrate 103 includes a qubit 104 formed on a first surface of qubit substrate 103. Qubit substrate 103 comprises a material with high thermal conductivity (above a threshold) in the cryogenic temperature range. For example, qubit substrate 103 may be formed using sapphire, silicon, quartz, gallium arsenide, fused silica, amorphous silicon, or diamond for operations in the temperature range of 77 K to 0.01K. These examples of substrate materials are not intended to be limiting. From this disclosure those of ordinary skill in the art will be able to conceive of many other materials suitable for forming the substrate and the same are contemplated within the scope of the illustrative embodiments.

Flip chip quantum computing device 100 further includes an interposer chip 106 including an interposer substrate 107. Interposer substrate 107 comprises a material with high thermal conductivity (above a threshold) in the cryogenic temperature range. For example, interposer substrate 107 may be formed using sapphire, silicon, quartz, gallium arsenide, fused silica, amorphous silicon, or diamond for operations in the temperature range of 77 K to 0.01K. These examples of substrate materials are not intended to be limiting. From this disclosure those of ordinary skill in the art will be able to conceive of many other materials suitable for forming the substrate and the same are contemplated within the scope of the illustrative embodiments.

Interposer chip 106 includes a conventional ground plane 108 formed on the first surface of interposer substrate 107. In a particular embodiment, one or more of qubit substrate 103 and interposer substrate 107 are formed of a silicon or other suitable substrate material. In a particular embodiment, ground plane 108 is formed of a superconductive material, multiple superconductive materials, a metal material, or a combination thereof. In the embodiment, qubit 104 has an associated qubit resonance frequency. Ground plane 108 of interposer chip 106 is bonded to qubit chip 102 by a first bump bond 110A and a second bump bond 110B. Bonding forms an electrical connection between interposer chip 106 and qubit chip 102. In an embodiment, ground plane 108 is formed using at least one of Aluminum, Niobium, Titanium, Titanium Nitride, Palladium, Gold, Silver, Copper, or Platinum for operations in the temperature range of 77 K to 0.01K. In an embodiment, bump bonds 110A, 110B are formed using Indium, Tin, and alloys of Bismuth for operations in the temperature range of 77 K to 0.01K. These examples of ground plane and bump bond materials are not intended to be limiting. From this disclosure those of ordinary skill in the art will be able to conceive of many other materials suitable for forming the first layer and the same are contemplated within the scope of the illustrative embodiments.

Qubit resonance frequency is difficult to control due to variations in Josephson junction (JJ) inductance during fabrication. Josephson junctions made by shadow evaporation, e.g., by a Dolan bridge technique, naturally show variations in their Josephson inductance. For identically designed and fabricated/processed single junction transmon qubits, each qubit may naturally have a different resonant frequency (e.g., with a variation of 100 MHz-2000 MHz). Such conditions may lead to frequency collisions for fixed frequency qubits using cross-resonance entangling gates such as frequency collisions between qubit 104 and a second, coupled qubit.

The illustrative embodiments recognize that preventing frequency collisions is a challenging issue for fixed frequency superconducting qubits, and changing or modifying the qubit frequency after chip fabrication is difficult using conventional methods. The frequency of a qubit is inversely proportional to the square root of the product of the Josephson inductance and the total capacitance across the Josephson junction. Accordingly, approaches to address frequency collisions includes changing the single-junction transmon qubit frequency by modifying the junction inductance or the total capacitance across (e.g., in parallel with) the junction.

Several approaches have been proposed to adjust the junction inductance in order to adjust the resonance frequency, but each have limitations and drawbacks. For example, changing the inductance is difficult to perform precisely. Alternately, frequency adjustment can be performed by changing capacitance, for example, by etching the substrate (e.g., a silicon (Si) substrate) in the gap of a planar capacitor to change the effective dielectric constant. However, such etching exposes the Josephson junction to significantly more fabrication processes. In addition, etching and related processing can introduce additional loss mechanisms. Further, etching and related processing can typically only be used to decrease capacitance and increase qubit frequency, but not to increase capacitance and correspondingly decrease qubit frequency.

An embodiment provides for a quantum processor in a flip chip geometry including a qubit chip and an interposer chip. The qubit chip includes one or more qubits defined on a substrate. The interposer chip includes a conducting area formed of a conducting material (e.g., a superconductive material and/or metal material) positioned opposite a qubit, the conducting area capable of having variable shapes and conducting region coverage to change the resonance frequencies of the one or more qubits. In the embodiment, the dimensions (e.g., conductive area and/or shapes) of the conducting area opposite each qubit are specifically designed for the particular qubit based on one or more measurements of the qubit such as electrical probing of the Josephson junction resistance to change the resonance frequency of the particular qubit to tune the frequency to a desired value (e.g., to avoid frequency collisions).

In one or more embodiments, the conducting area of the interposer chip can vary in dimension, for example, size, geometry, style, and/or connections to ground, to adjust the frequency of the qubit to a desired value. In one or more embodiments, the tuning range and sensitivity of the frequency adjustment of the interposer chip depends on a separation distance between the qubit chip and the interposer chip.

An embodiment provides for a novel design and fabrication method to modify single junction qubit frequency of a qubit in a flip chip geometry by capacitance adjustment. In the embodiment, a design/fabrication system designs and fabricates a qubit chip having one or more qubits using conventional processes, and generates an interposer chip design template having an empty space above the qubits.

In an embodiment, the design/fabrication system measures a Josephson junction (JJ) normal-state resistance of each of the qubits, for example, by electrically probing the JJ resistance of each qubit above the superconducting transition temperature. In the embodiment, the design/fabrication system calculates a predicted frequency of a qubit based upon the measured JJ resistance. In a particular embodiment, the design/fabrication system uses a fitted curve relating JJ resistance to frequency to calculate the predicted frequency of each qubit. Although various embodiments describe measurement of a resistance of the qubit, in other embodiments measurement of one or more other suitable parameters, such as a capacitance or inductance, may be used.

In an embodiment, the design/fabrication system determines possible frequency collisions based upon the predicted frequency of each qubit, and calculates a frequency adjustment for each qubit to avoid or mitigate the possible frequency collision. In the embodiment, the design/fabrication system calculates, using an equation described herein, a capacitance change needed for each qubit to achieve the calculated frequency adjustment, and determines a particular ground plane design corresponding to calculated capacitance change. In an embodiment, the design/fabrication system fabricates the interposer substrate, and fabricates a ground plane corresponding to the design on the interposer substrate.

In an embodiment, the design/fabrication system determines a separation gap distance between the interposer chip and the qubit chip based upon the desired frequency adjustment, frequency tuning range, and sensitivity. In the embodiment, the design/fabrication system bonds the interposer chip and qubit chip at the separation gap distance to achieve the desired qubit frequencies in the flip chip arrangement. In a particular embodiment, the design/fabrication system bonds the interposer chip and qubit chip. In one embodiment, the bonding is performed using a bump bond process. In other particular embodiments, other suitable methods of bonding the interposer chip and the qubit chip may be used.

Another embodiment provides a fabrication method for the qubit frequency tuning structures for flip chip quantum computing devices, such that the method can be implemented as a software application. The application implementing a fabrication method embodiment can be configured to operate in conjunction with an existing superconducting fabrication system—such as a lithography system.

For the clarity of the description, and without implying any limitation thereto, the illustrative embodiments are described using an example number of qubits arranged on a substrate. An embodiment can be implemented with a different number of qubits, different arrangements, a superconducting device other than a qubit, types of qubits not based on superconductors, or some combination thereof, within the scope of the illustrative embodiments. An embodiment can be implemented to similarly improve other superconducting fabrications where a frequency tuning structure for a quantum computing device or superconducting element is desired.

Furthermore, a simplified diagram of the example frequency tuning structure is used in the figures and the illustrative embodiments. In an actual fabrication of a frequency tuning structure, additional structures that are not shown or described herein, or structures different from those shown and described herein, may be present without departing the scope of the illustrative embodiments. Similarly, within the scope of the illustrative embodiments, a shown or described structure in the example frequency tuning structure may be fabricated differently to yield a similar operation or result as described herein.

Differently shaded portions in the two-dimensional drawing of the example structures, layers, and formations are intended to represent different structures, layers, materials, and formations in the example fabrication, as described herein. The different structures, layers, materials, and formations may be fabricated using suitable materials that are known to those of ordinary skill in the art.

A specific shape, location, position, or dimension of a shape depicted herein is not intended to be limiting on the illustrative embodiments unless such a characteristic is expressly described as a feature of an embodiment. The shape, location, position, dimension, or some combination thereof, are chosen only for the clarity of the drawings and the description and may have been exaggerated, minimized, or otherwise changed from actual shape, location, position, or dimension that might be used in actual lithography to achieve an objective according to the illustrative embodiments.

Furthermore, the illustrative embodiments are described with respect to a specific actual or hypothetical superconducting device, e.g., a qubit, only as an example. The steps described by the various illustrative embodiments can be adapted for fabricating a variety of frequency tuning structures in a similar manner, and such adaptations are contemplated within the scope of the illustrative embodiments.

An embodiment when implemented in an application causes a fabrication process to perform certain steps as described herein. The steps of the fabrication process are depicted in the several figures. Not all steps may be necessary in a particular fabrication process. Some fabrication processes may implement the steps in different order, combine certain steps, remove or replace certain steps, or perform some combination of these and other manipulations of steps, without departing the scope of the illustrative embodiments.

The illustrative embodiments are described with respect to certain types of materials, electrical properties, structures, formations, layers orientations, directions, steps, operations, planes, dimensions, numerosity, data processing systems, environments, components, and applications only as examples. Any specific manifestations of these and other similar artifacts are not intended to be limiting to the invention. Any suitable manifestation of these and other similar artifacts can be selected within the scope of the illustrative embodiments.

The illustrative embodiments are described using specific designs, architectures, layouts, schematics, and tools only as examples and are not limiting to the illustrative embodiments. The illustrative embodiments may be used in conjunction with other comparable or similarly purposed designs, architectures, layouts, schematics, and tools.

An advantage that may be provided by an embodiment is that the qubit frequency tuning structures allow for both an increase and decrease in the qubit resonance frequency. Another advantage that may be provided by an embodiment is that there is no need for additional processes on the qubit chip after fabrication which provides for no risk of junction damage or failure. Another advantage that may be provided by an embodiment, is that of providing accurate control of frequency change in a qubit.

The examples in this disclosure are used only for the clarity of the description and are not limiting to the illustrative embodiments. Any advantages listed herein are only examples and are not intended to be limiting to the illustrative embodiments. Additional or different advantages may be realized by specific illustrative embodiments. Furthermore, a particular illustrative embodiment may have some, all, or none of the advantages listed above.

Figure 2:
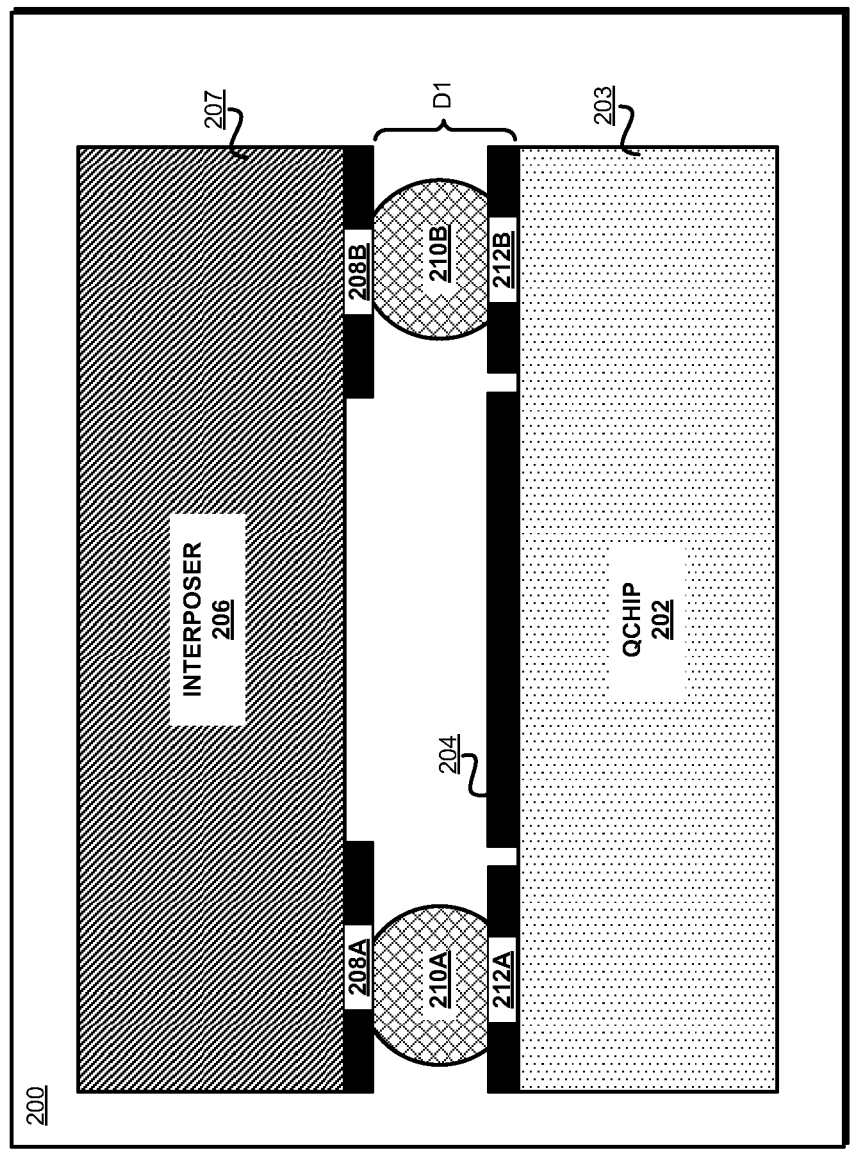
FIG. 2 depicts a cross-section view of an example qubit frequency tuning structure for a flip chip quantum computing device in accordance with an illustrative embodiment.

With reference to FIG. 2, this figure depicts a cross-section view of an example qubit frequency tuning structure for a flip chip quantum computing device 200 in accordance with an illustrative embodiment. Flip chip quantum computing device 200 includes a qubit chip 202 having a qubit substrate 203. Qubit substrate 203 includes a qubit 204 formed on a first surface of qubit substrate 203. In the embodiment, qubit 204 has an associated qubit resonance frequency. Qubit substrate 203 comprises a material with high thermal conductivity (above a threshold) in the cryogenic temperature range. For example, qubit substrate 203 may be formed using sapphire, silicon, quartz, gallium arsenide, fused silica, amorphous silicon, or diamond for operations in the temperature range of 77 K to 0.01K Flip chip quantum computing device 200 further includes an interposer chip 206 including an interposer substrate 207. Interposer substrate 207 comprises a material with high thermal conductivity (above a threshold) in the cryogenic temperature range. For example, interposer substrate 207 may be formed using sapphire, silicon, quartz, gallium arsenide, fused silica, amorphous silicon, or diamond for operations in the temperature range of 77 K to 0.01K. These examples of qubit and interposer substrate materials are not intended to be limiting. From this disclosure those of ordinary skill in the art will be able to conceive of many other materials suitable for forming the substrate and the same are contemplated within the scope of the illustrative embodiments.

Interposer chip 206 includes a qubit frequency tuning structure including a ground plane including ground plane portions 208A and 208B formed on the surface of interposer substrate 207 and surrounding an open area (e.g., nonmetal area) that overshadows qubit 204. By varying the open area, shape, and superconducting metal coverage, the resonance frequency of qubit 204 can be adjusted to avoid or mitigate frequency collisions between qubit 204 and another qubit.

Ground plane portions 208A, 208B of interposer chip 206 are bonded to qubit chip 202 by a first bump bond 210A and a second bump bond 210B at a determined separation gap distance D1 based upon the desired frequency adjustment, frequency tuning range, and sensitivity. In a particular embodiment, one or more of qubit substrate 203 and interposer substrate 207 are formed of a silicon material. In a particular embodiment, ground planes 208A and 208B are formed of a superconducting or metal material.

In an embodiment, ground planes 208A, 208B are formed using at least one of Aluminum, Niobium, Titanium, Titanium Nitride, Palladium, Gold, Silver, Copper, or Platinum for operations in the temperature range of 77 K to 0.01K. In an embodiment, bump bonds 210A, 210B are formed using Indium, Tin, and alloys of Bismuth for operations in the temperature range of 77 K to 0.01K. These examples of ground plane and bump bond materials are not intended to be limiting. From this disclosure those of ordinary skill in the art will be able to conceive of many other materials suitable for forming the first layer and the same are contemplated within the scope of the illustrative embodiments.

In an embodiment, the resonance frequency of first qubit 204 is predicted based upon a measurement (e.g., a probe measurement) of the JJ resistance of qubit 204, and possible frequency collisions between qubit 204 and other qubits are determined. In the embodiment, a frequency adjustment needed for qubit 204 to avoid the possible frequency collision, and a capacitance change needed for qubit 204 to achieve the frequency adjustment are calculated. In one or more embodiments, each qubit of a qubit circuit may have its own associated ground plane that has been constructed to adjust the frequency of each of the qubits by a desired amount.

Figure 3:
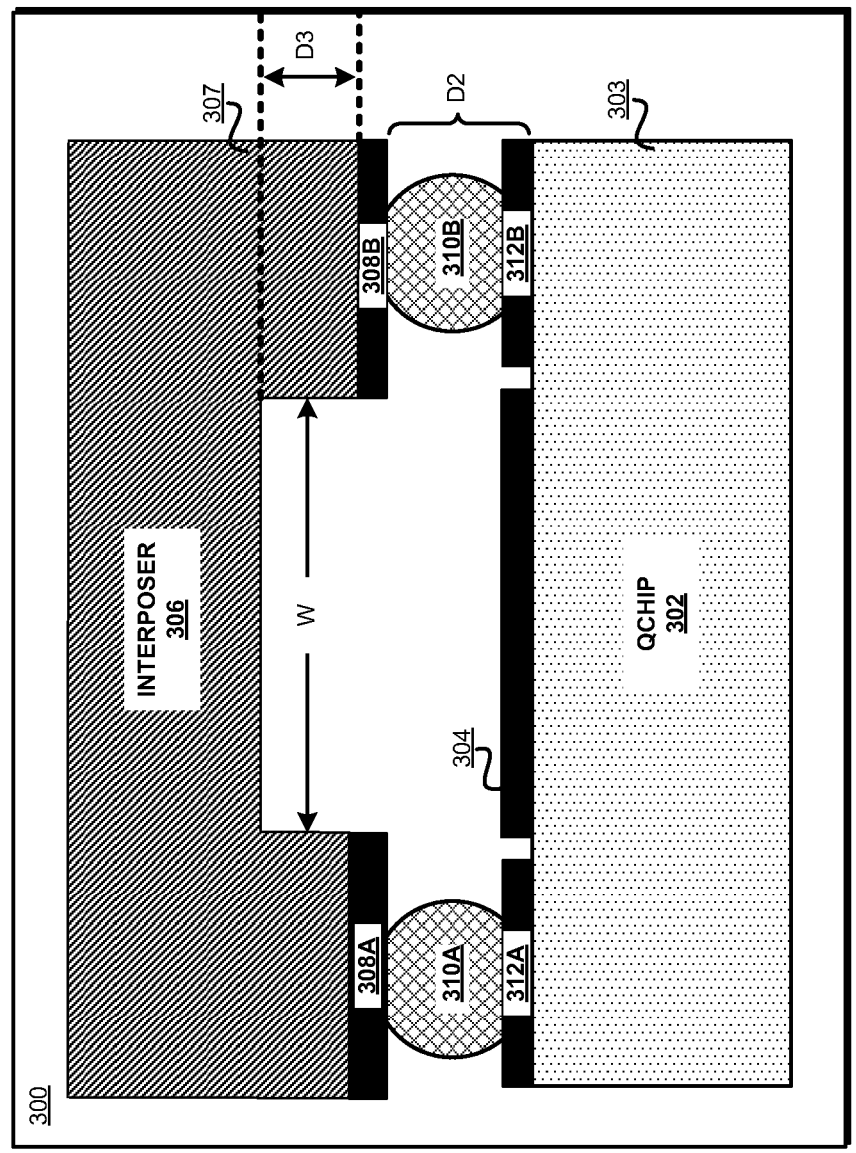
FIG. 3 depicts a cross-section view of another example qubit frequency tuning structure for a flip chip quantum computing device in accordance with an illustrative embodiment.

With reference to FIG. 3, this figure depicts a cross-section view of another example qubit frequency tuning structure for a flip chip quantum computing device 300 in accordance with an illustrative embodiment. Flip chip quantum computing device 300 includes a qubit chip 302 having a qubit substrate 303. Qubit substrate 303 includes a qubit 304 formed on a first surface of qubit substrate 303. In the embodiment, qubit 304 has an associated qubit resonance frequency.

Flip chip quantum computing device 300 further includes an interposer chip 306 including an interposer substrate 307. In the embodiment of FIG. 3, a portion of interposer substrate 307 is etched at a depth of D3 and a width w to remove dielectric material of interposer substrate 307. Interposer chip 306 includes a qubit frequency tuning structure including a ground plane including ground plane portions 308A and 308B formed on the surface of interposer substrate 307 and surrounding an open area (e.g., nonmetal area) that overshadows qubit 304. By varying the open area, shape, and superconducting metal coverage, the resonance frequency of qubit 304 can be adjusted to avoid or mitigate frequency collisions between qubit 304 and another qubit.

Ground plane 308 of interposer chip 306 is bonded to qubit chip 302 by a first bump bond 310A and a second bump bond 310B at a determined separation gap distance D2 based upon the desired frequency adjustment, frequency tuning range, and sensitivity. In a particular embodiment, one or more of qubit substrate 303 and interposer substrate 307 are formed of a silicon material. In a particular embodiment, ground planes 308A and 308B are formed of a superconducting or metal material.

In an embodiment, the resonance frequency of each of qubit 304 and another qubit are predicted based upon a measurement of the JJ resistance of each of qubit 304 and the other qubit, and possible frequency collisions between qubit 304 and the other qubit are determined. In the embodiment, a frequency adjustment for each of qubit 304 and the other qubit to avoid the possible frequency collision and a capacitance change needed for each of qubit 304 and the other qubit needed to achieve the frequency adjustment are calculated. In one or more embodiments, each qubit of a qubit circuit may have its own associated ground plane that has been constructed to adjust the frequency of each of the qubits by a desired amount.

Figure 4:
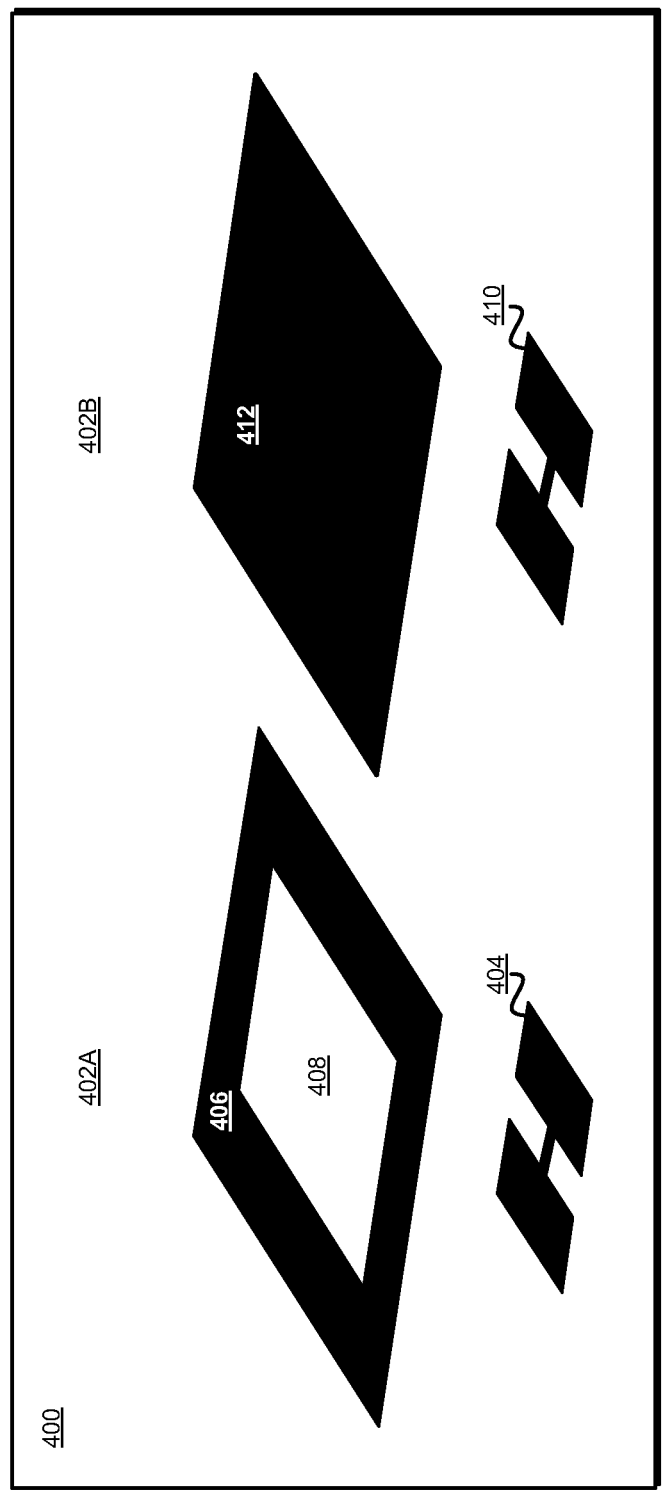
FIG. 4 depicts examples ground plane designs for qubit frequency tuning structures for flip chip quantum computing devices in accordance with an illustrative embodiment.

With reference to FIG. 4, this figure depicts example ground plane designs for qubit frequency tuning structures for flip chip quantum computing devices in accordance with an illustrative embodiment. Perspective view 400 includes a first qubit frequency tuning structure 402A and a second qubit frequency tuning structure 402B. First qubit frequency tuning structure 402A includes a first qubit 404 for forming on a qubit substrate of a qubit chip and a first ground plane design 406 for forming on an interposer substrate of an interposer chip. First ground plane design 406 is formed as a conductive surface of a conductive material such as a superconductor material and/or metal material and includes a void 408 within first ground plane design 406. In the embodiment illustrated in first ground plane design 406 and void 408 are of a rectangular shape.

Second qubit frequency tuning structure 402B includes a second qubit 410 for forming on the qubit substrate of the qubit chip and a second ground plane design 412 for forming on the interposer substrate of the interposer chip. Second ground plane design 412 is formed as a conductive surface of a conductive material such as a superconductor material and/or metal material and is of a rectangular shape.

In the illustrated embodiment, first ground plane design 406 of first qubit frequency tuning structure 402A includes less conductive material resulting in reduced capacitance and is of a different shape than second ground plane design 412 of second qubit frequency tuning structure 402B. Accordingly, first ground plane design 406 provides for a different frequency adjustment to the resonant frequencies of first qubit 404 than that provided by second ground plane design 412 to second qubit 410.

Figure 5:
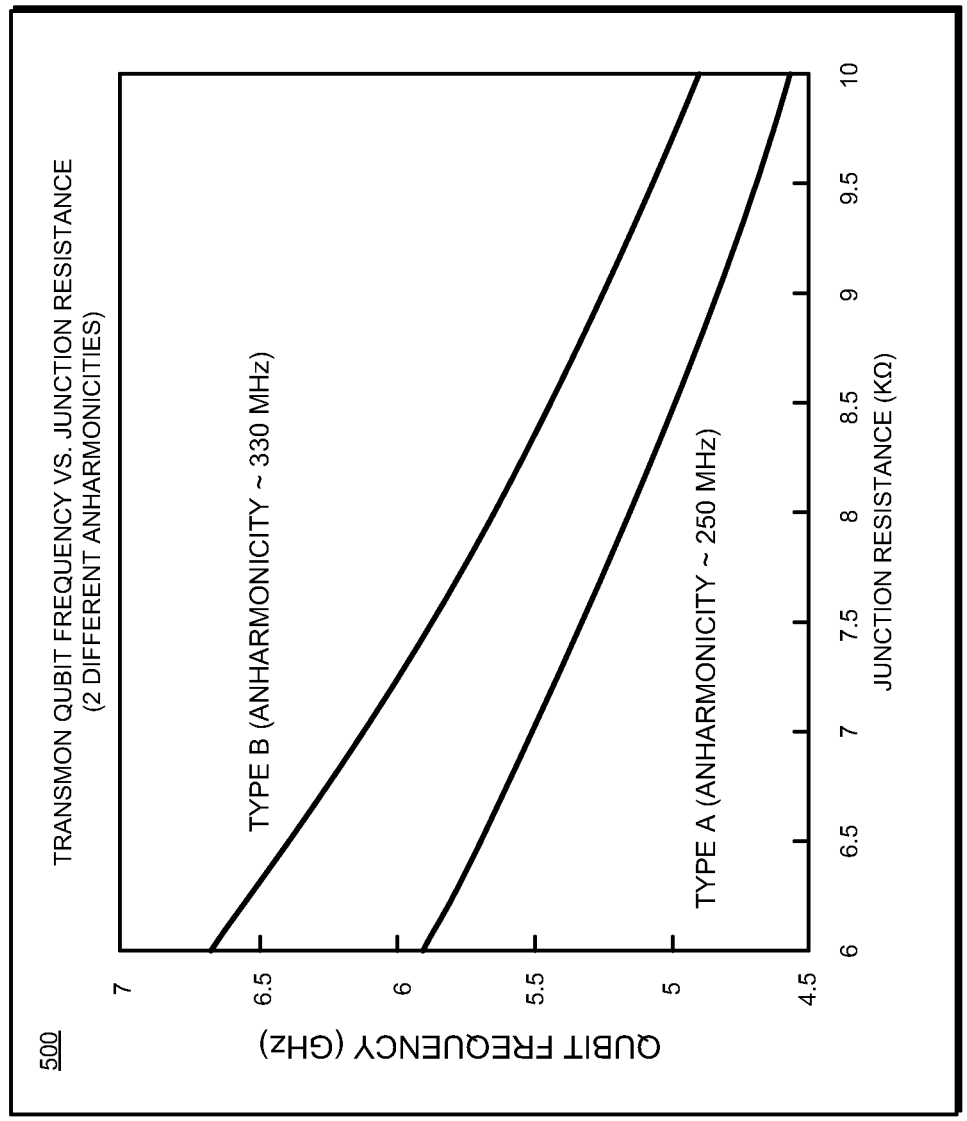
FIG. 5 depicts an example graph for calculating a predicted frequency of a qubit based upon a measured junction resistance in accordance with an illustrative embodiment.

With reference to FIG. 5, this figure depicts an example graph 500 for calculating a predicted frequency of a qubit based upon a measured junction resistance in accordance with an illustrative embodiment. FIG. 5 illustrates a graph of a predicted qubit frequency f01 versus a Josephson junction resistance R of a qubit include a first curve 502 and a second curve 504. In accordance with an embodiment, a resistance of the Josephson junction of a qubit is measured (e.g., by electrical probing) to obtain a resistance R. Based upon the measured resistance R, a predicted resonance frequency of the qubit may be determined using graph 500.

Figure 6:
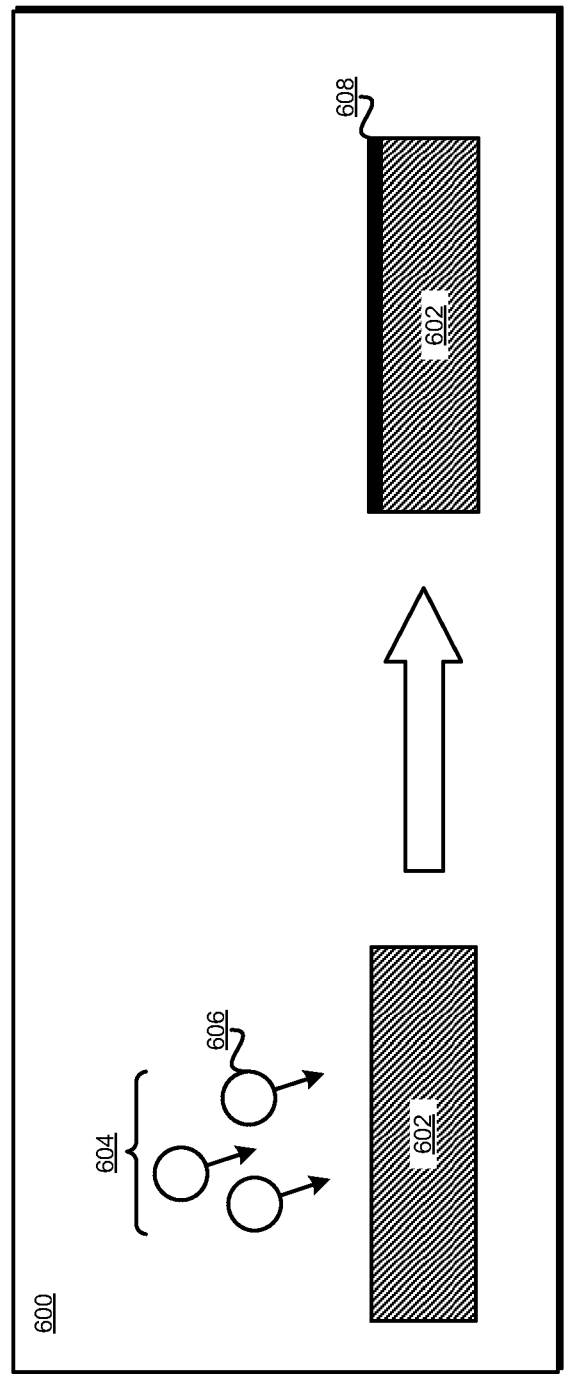
FIG. 6 depicts a block diagram of an example interposer chip fabrication process step in accordance with an illustrative embodiment.

With reference to FIG. 6, this figure depicts a block diagram of an example interposer chip fabrication process step in accordance with an illustrative embodiment. A fabrication system produces or manipulates interposer chip configuration 600 as described herein. An embodiment causes the fabrication system to deposit material 604, thus forming ground plane 608 on a first surface of interposer substrate 602. In an embodiment, material 604 is a thin film deposition of particles 606. In another embodiment, material 604 is deposited by sputtering. These examples of deposition methods are not intended to be limiting. From this disclosure, those of ordinary skill in the art will be able to conceive of many other methods and process suitable for forming the ground plane and the same are contemplated within the scope of the illustrative embodiments.

Figure 7:
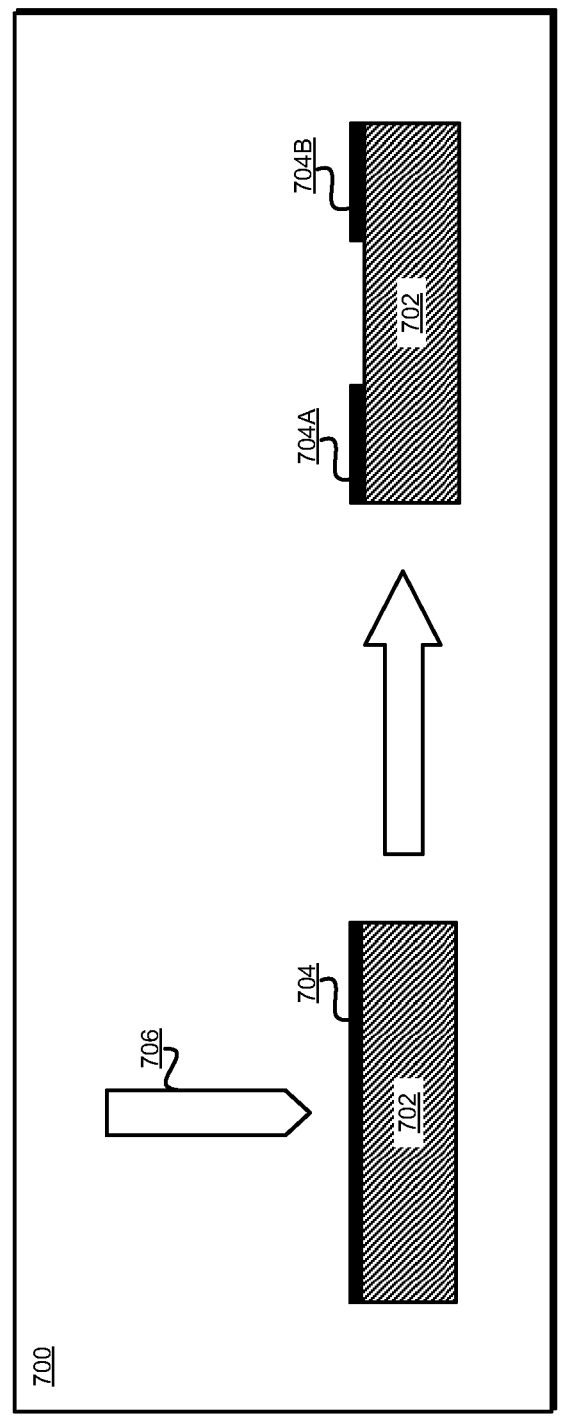
FIG. 7 depicts a block diagram of another example interposer chip fabrication process step in accordance with an illustrative embodiment.

With reference to FIG. 7, this figure depicts a block diagram of an example interposer chip fabrication process step in accordance with an illustrative embodiment. An embodiment causes a fabrication system to form ground plane portions 704A, 704B from ground plane 704 on a first surface of interposer substrate 702. For example, milling device 706 can be configured to remove a portion of the ground plane 704 to form ground plane portions 704A, 704B. As another example, etching, such as reactive-ion etching or wet etching, can be used to form ground plane portions 704A, 704B. Removing ground plane material reduces capacitor area of the interposer chip configuration 700, thereby changing the effective capacitance and the resonance frequency of a corresponding qubit.

In an embodiment, milling device 706 is a micro-milling device with diamond milling bits or a laser mill. These examples of milling devices are not intended to be limiting. From this disclosure, those of ordinary skill in the art will be able to conceive of many other milling devices suitable for removing a portion of ground plane material on an interposer substrate and the same are contemplated within the scope of the illustrative embodiments. Furthermore, from this disclosure, those of ordinary skill in the art will be able to conceive of many other devices and methods suitable for removing a portion of ground plane material on an interposer substrate and the same are contemplated within the scope of the illustrative embodiments.

Figure 8:
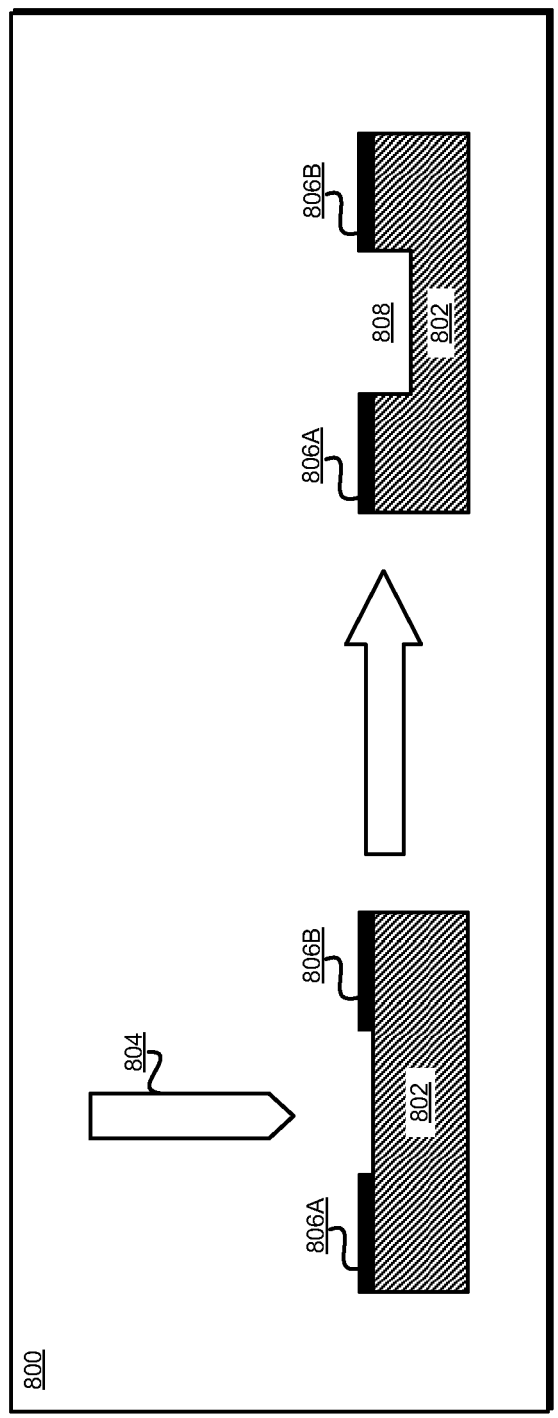
FIG. 8 depicts a block diagram of another example interposer chip fabrication process step in accordance with an illustrative embodiment.

With reference to FIG. 8, this figure depicts a block diagram of an example interposer chip fabrication process step in accordance with an illustrative embodiment. An embodiment causes a fabrication system to form a recess 808 in a first surface of interposer substrate 802. For example, milling device 804 can be configured to remove a portion of the interposer substrate 802 to form recess 808. As another example, etching, such as reactive-ion etching or wet etching, can be used to form recess 808. Removing substrate material reduces an effective dielectric constant of the interposer chip configuration 800, thereby decreasing the effective capacitance and increasing the resonance frequency of a corresponding qubit.

In an embodiment, recess 808 includes a rectangular cross-section. In an embodiment, recess 808 is formed between ground plane portions 806A, 806B. In an embodiment, milling device 804 is a micro-milling device with diamond milling bits or a laser mill. These examples of milling devices are not intended to be limiting. From this disclosure, those of ordinary skill in the art will be able to conceive of many other milling devices suitable for forming a recess in a first surface of an interposer substrate and the same are contemplated within the scope of the illustrative embodiments. Furthermore, from this disclosure, those of ordinary skill in the art will be able to conceive of many other devices and methods suitable for forming a recess in a first surface of an interposer substrate and the same are contemplated within the scope of the illustrative embodiments.

Figure 9:
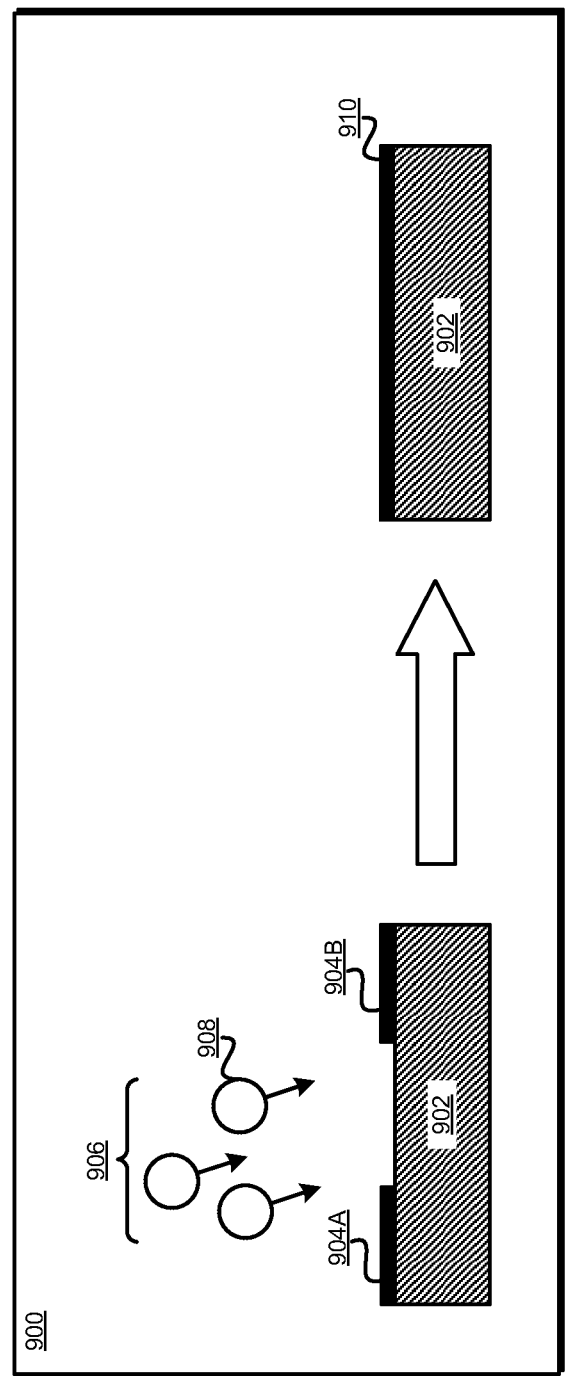
FIG. 9 depicts a block diagram of another example interposer chip fabrication process step in accordance with an illustrative embodiment.

With reference to FIG. 9, this figure depicts a block diagram of an example interposer chip fabrication process step in accordance with an illustrative embodiment. A fabrication system produces or manipulates interposer chip configuration 900 as described herein. An embodiment causes the fabrication system to deposit material 906, thus forming ground plane 910 on a first surface of interposer substrate 902. In an embodiment, ground plane 910 connects ground plane portions 904A, 904B. Depositing ground plane material changes a capacitor area of the interposer chip configuration 900, thereby changing the effective capacitance and the resonance frequency of a corresponding qubit.

In an embodiment, material 906 is a thin film deposition of particles 908. In another embodiment, material 906 is deposited by sputtering. These examples of deposition methods are not intended to be limiting. From this disclosure, those of ordinary skill in the art will be able to conceive of many other methods and process suitable for forming the ground plane and the same are contemplated within the scope of the illustrative embodiments.

Figure 10:
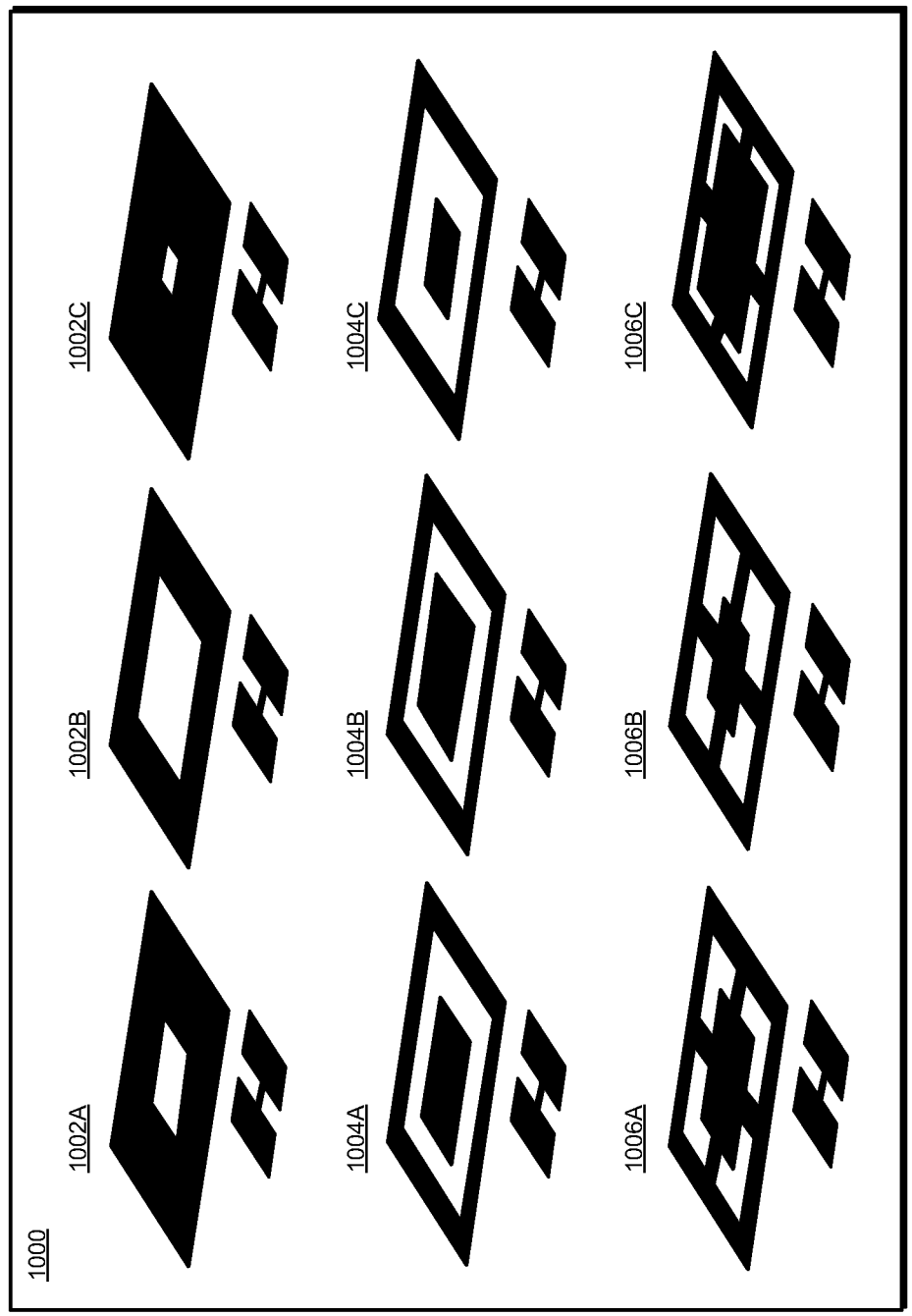
FIG. 10 depicts example variable ground plane designs for qubit frequency tuning structures for flip chip quantum computing devices in accordance with an illustrative embodiment.

With reference to FIG. 10, this figure depicts example variable ground plane designs for qubit frequency tuning structures for flip chip quantum computing devices in accordance with an illustrative embodiment. Perspective view 1000 includes a first qubit frequency tuning structure 1002A, a second qubit frequency tuning structure 1002B, a third qubit frequency tuning structure 1002C, a fourth qubit frequency tuning structure 1004A, a fifth qubit frequency tuning structure 1004B, a sixth qubit frequency tuning structure 1004C, a seventh qubit frequency tuning structure 1006A, an eighth qubit frequency tuning structure 1006B, and a ninth qubit frequency tuning structure 1006C. The qubit frequency tuning structures can be formed using the process steps in FIGS. 6-9.

Each of qubit frequency tuning structures 1002A-1002C, 1004A-1004C, and 1006A-1006C include a qubit for forming on a qubit chip and an associated ground plane design for forming on an interposer chip. Each of qubit frequency tuning structures 1002A-1002C, 1004A-1004C, and 1006A-1006C have a different ground plane size and shape configured to have different capacitance values and provide a corresponding different amount of frequency adjustment to a resonance frequency of the associated qubit.

Qubit frequency tuning structures 1002A-1002C have a rectangular ground plane design with a central rectangular void therein. The rectangular void within each of 1002A-1002C is of a different size and different conductor material area resulting in a different capacitance and frequency adjustments of the associated qubit.

Qubit frequency tuning structures 1004A-1004C have an outer rectangular ground plane and inner rectangular ground plane positioned with a void of the outer rectangular ground plane and unconnected to the outer rectangular ground plane. The inner ground plane of each of 1004A-1004C is of a different size and different conductor material area resulting in a different capacitance and frequency adjustments of the associated qubit.

Qubit frequency tuning structures 1006A-1006C have an outer rectangular ground plane and inner rectangular ground plan positioned with a void of the outer rectangular ground plane and connected at each edge to the outer rectangular ground plane. The inner ground plane of each of 1006A-1006C is of a different size and different conductor material area resulting in a different capacitance and frequency adjustments of the associated qubit.

Figure 11:
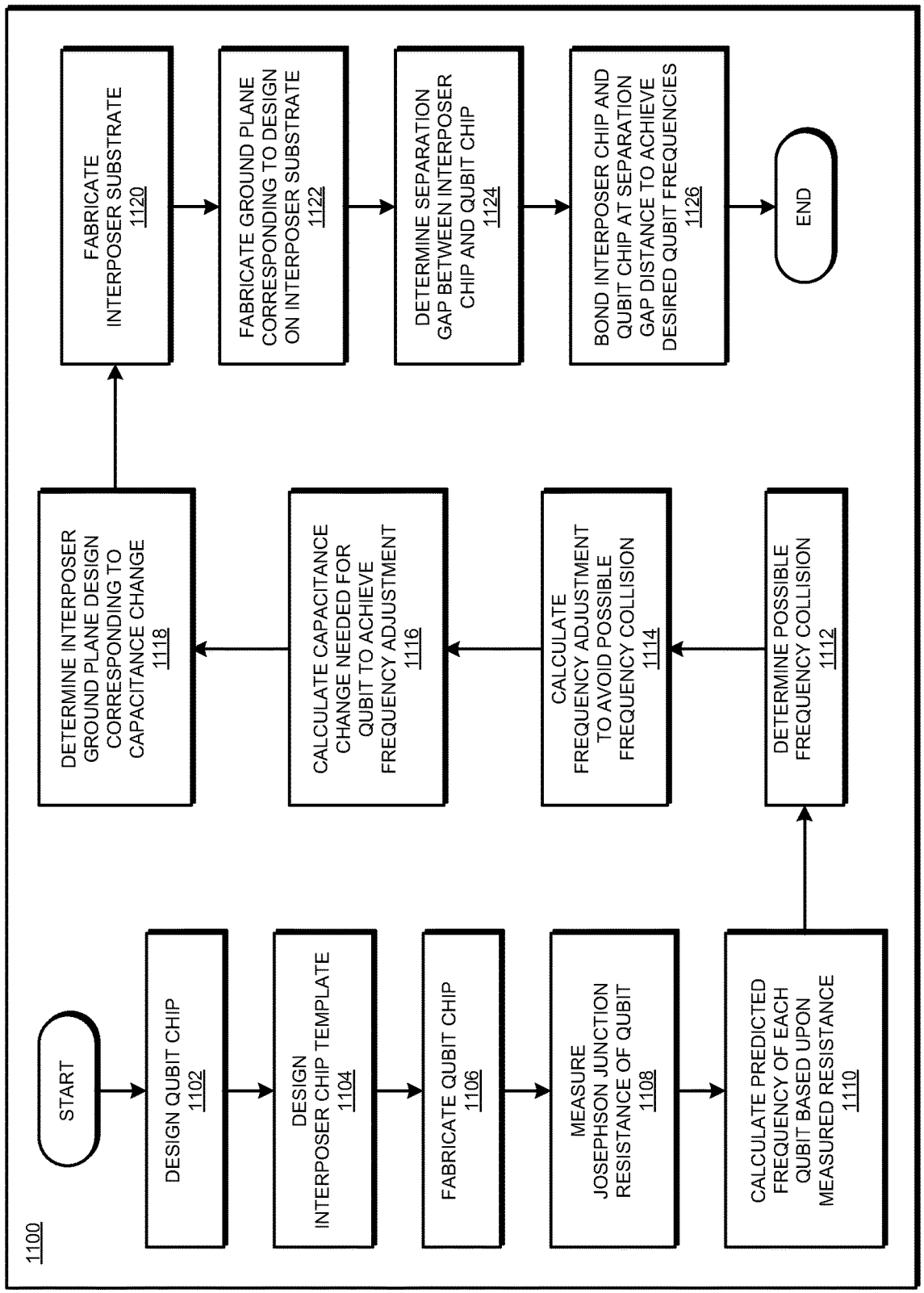
FIG. 11 depicts a flowchart of an example process for fabricating a qubit frequency tuning structure for a flip chip quantum computing device in accordance with an illustrative embodiment.

With reference to FIG. 11, this figure depicts a flowchart of an example process 1100 for fabricating a qubit frequency tuning structure for a flip chip quantum computing device in accordance with an illustrative embodiment. In one or more embodiments, process 1100 is implemented in part by a fabrication system.

In block 1102, a user designs a qubit chip having one or more qubits using a known process. In block 1104, the user designs an interposer chip template having an empty space above the qubits. In block 1106, a fabrication system fabricates the qubit chip including the one or more qubits on a qubit substrate.

In block 1108, a fabrication system measures a Josephson junction (JJ) resistance of each of the qubits, for example, by electrically probing the JJ resistance of each qubit. In block 1110, the fabrication system calculates a predicted frequency of each qubit based upon the measured JJ resistance. In a particular embodiment, the design/fabrication system uses a fitted curve relating JJ resistance to frequency to calculate the predicted frequency of each qubit such as graph 500 of FIG. 5.

In block 1112, the fabrication system determines possible frequency collisions based upon the predicted frequency of each qubit. In block 1114, the fabrication system calculates a frequency adjustment for each qubit to avoid or mitigate the possible frequency collisions. In block 1116, the fabrication system calculates a capacitance change needed for each qubit to achieve the calculated frequency adjustment. In block 1118, the fabrication system determines a particular interposer ground plane design corresponding to the calculated capacitance change. In a particular embodiment, the fabrication system selects a predefined ground plane design configured to achieve the desired capacitance change such as one or more of the ground plane designs shown in FIG. 10.

In block 1120, the fabrication system fabricates an interposer substrate for the interposer chip. In block 1122, the fabrication system fabricates a ground plane corresponding to the determined ground plane design on the interposer substrate. In block 1124, the fabrication system determines a separation gap distance between the interposer chip and the qubit chip based upon the desired frequency adjustment, frequency tuning range, and sensitivity.

In block 1126, the fabrication system bonds the interposer chip and qubit chip at the determined separation gap distance to achieve the desired qubit frequencies in the flip chip arrangement. In a particular embodiment, the fabrication system bonds the interposer chip and qubit chip using a bump bond process. In other particular embodiments, other suitable methods of bonding the interposer chip and the qubit chip may be used. Process 1100 then ends.

Figure 12:
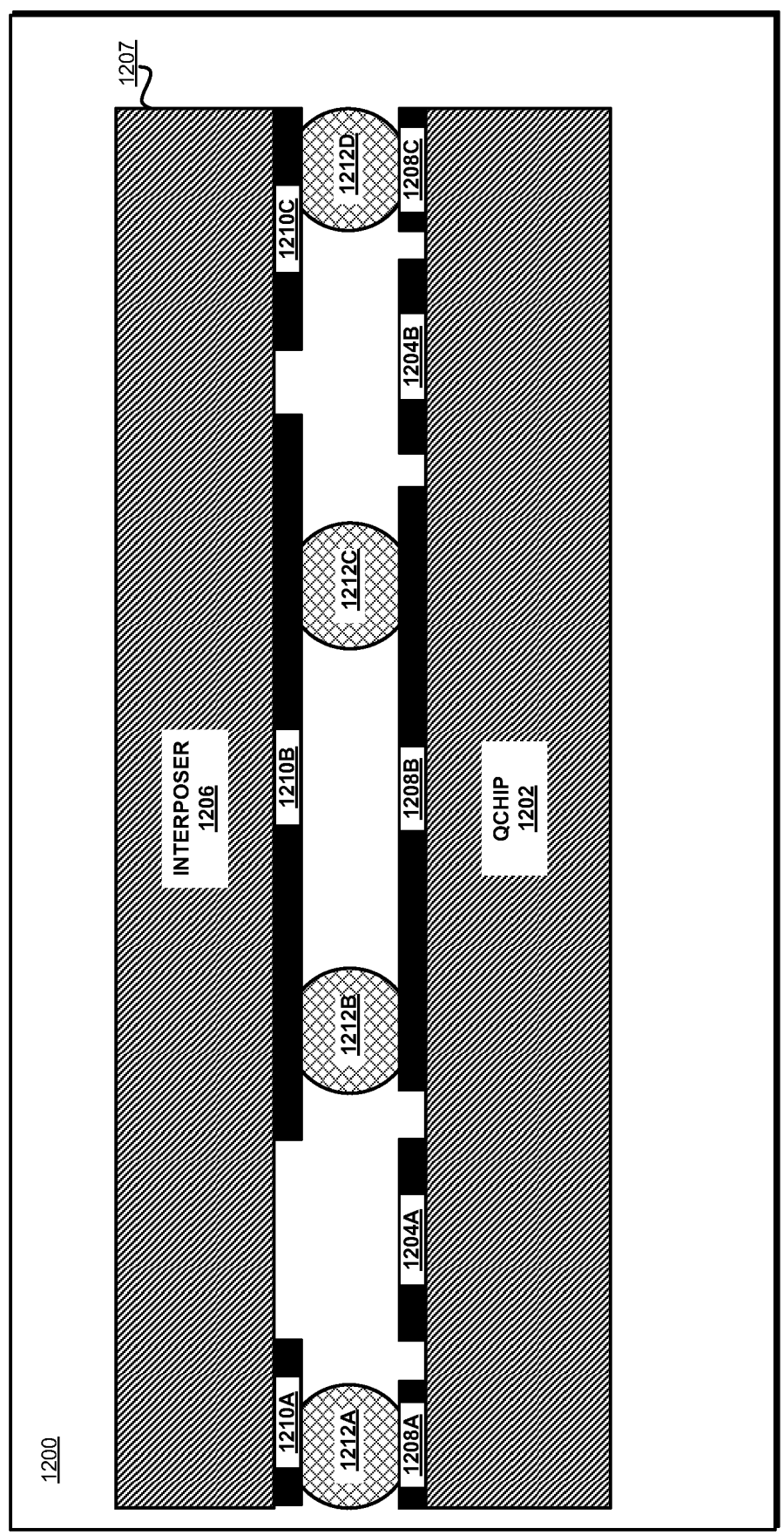
FIG. 12 depicts a cross-section view of example qubit frequency tuning structures for a multi-qubit flip chip quantum computing device in accordance with an illustrative embodiment.

With reference to FIG. 12, this figure depicts a cross-section view of example qubit frequency tuning structures for a multi-qubit flip chip quantum computing device 1200 in accordance with an illustrative embodiment. Flip chip quantum computing device 1200 includes a qubit chip having a qubit substrate 1202. Qubit substrate 1202 includes a first qubit 1204A and a second qubit 1204B formed on a first surface of qubit substrate 1202. In the embodiment, each of first qubit 1204A and second qubit 1204B has an associated qubit resonance frequency. A first qubit contact 1208A, second qubit contact 1208B, and a third qubit contact 1208C are formed on the surface of qubit substrate 1202. First qubit 1204A is disposed between first qubit contact 1208A and second qubit contact 1208B, and second qubit 1204B is disposed between second qubit contact 1208B and third qubit contact 1208C.

Flip chip quantum computing device 1200 further includes an interposer chip 1206 including an interposer substrate 1207. Interposer chip 1206 includes qubit frequency tuning structures including ground plane portions 1210A, 1210B, and 1210C formed on the surface of interposer substrate 1207. First ground plane portion 1210A and second ground plane portion 1210B partially overlay a portion of first qubit 1204A and an open area (e.g., nonmetal area) between first ground plane portion 1210A and second ground plane portion 1210B overshadows first qubit 1204A. Similarly, second ground plane portion 1210B and third ground plane portion 1210C partially overlay a portion of second qubit 1204B and an open area (e.g., nonmetal area) between second ground plane portion 1210B and third ground plane portion 1210C overshadows second qubit 1204B. By varying the open area, shape, and superconducting metal coverage of each of ground plane portions 1210A-1210C, the resonance frequency of each of first qubit 1204A and second qubit 1204B can be adjusted to avoid or mitigate frequency collisions between first qubit 1204A and second qubit 1204B.

First ground plane portion 1210A of interposer chip 1206 is bonded to first qubit contact 1208A by a first bump bond 1212A, and second ground plane portion 1210B is bonded to second qubit contact 1208B by a second bump bond 1212B and a third bump bond 1212C. Third ground plane portion 1210C is bonded to third qubit contact 1208C by a forth bump bond 1212D. In a particular embodiment, one or more of qubit substrate 1202 and interposer substrate 1207 are formed of a silicon material. In a particular embodiment, ground plane portions 1210A-1210C are formed of a superconducting or metal material.

In an embodiment, the resonance frequency of each of first qubit 1204A and second qubit 1204B are predicted based upon a measurement of the JJ resistance of each of first qubit 1204A and second qubit 1204B, and possible frequency collisions between first qubit 1204A and second qubit 1204B are determined. In the embodiment, a frequency adjustment for each of first qubit 1204A and second qubit 1204B to avoid the possible frequency collision and a capacitance change needed for each of first qubit 1204A and second qubit 1204B needed to achieve the frequency adjustment are calculated. In one or more embodiments, each qubit of a qubit circuit (e.g., first qubit 1204A and second qubit 1204B) may have its own associated ground plane that has been constructed to adjust the frequency of each of the qubits by a desired amount.

Various embodiments of the present invention are described herein with reference to the related drawings. Alternative embodiments can be devised without departing from the scope of this invention. Although various connections and positional relationships (e.g., top, bottom, over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "illustrative" is used herein to mean "serving as an example, instance or illustration." Any embodiment or design described herein as "illustrative" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A quantum computing device, comprising:
a first chip having one or more qubits, each of the one or more qubits having a corresponding associated resonance frequency; and
a second chip having at least one conductive surface, the second chip having a recess formed therein that extends through an opening in the at least one conductive surface at least to the second substrate, wherein the at least one conductive surface has at least one dimension configured to adjust the resonance frequency associated with at least one of the one or more qubits.

2. The quantum computing device of claim 1, wherein the at least one dimension of the conductive surface is based upon a measurement of a parameter associated with each of the one or more qubits.

3. The quantum computing device of claim 2, wherein the resonance frequency associated with a particular qubit is a predicted resonance frequency calculated based upon the measured parameter.

4. The quantum computing device of claim 2, wherein the parameter includes a resistance associated with the one or more qubits.

5. The quantum computing device of claim 4, wherein the resistance is a normal-state resistance of a junction of the qubit.

6. The quantum computing device of claim 5, wherein the junction is a Josephson junction of the qubit.

7. The quantum computing device of claim 1, wherein the at least one dimension is determined based upon a capacitance change to achieve the frequency adjustment value.

8. The quantum computing device of claim 1, wherein the at least one dimension includes at least one of a shape or an area of the at least one conducting surface.

9. The quantum computing device of claim 1, wherein the frequency adjustment value is determined such that the frequency adjustment value mitigates a frequency collision between the resonance frequencies associated with the one or more qubits.

10. The quantum computing device of claim 1, wherein the at least one conductive surface includes a ground plane.

11. The quantum computing device of claim 1, wherein the at least one conductive surface is formed of at least one of (i) a superconductive material or (ii) a metal material.

12. The quantum computing device of claim 1, wherein the first chip and the second chip are disposed in a flip chip arrangement.

13. The quantum computing device of claim 1, wherein the first chip and the second chip are coupled together at a predetermined distance based upon at least one of a frequency tuning range or a tuning sensitivity.

14. The quantum computing device of claim 1, wherein the conductive surface is of at least one member selected from a set comprising Aluminum, Niobium, Titanium, Titanium Nitride, Palladium, Silver, Copper, Platinum, and Gold.

15. The quantum computing device of claim 1, wherein a first substrate in the first chip is of at least one member selected from a set comprising sapphire, silicon, quartz, gallium arsenide, fused silica, amorphous silicon, and diamond.

16. The quantum computing device of claim 1, wherein a second substrate in the second chip is of at least one member selected from a set comprising sapphire, silicon, quartz, gallium arsenide, fused silica, amorphous silicon, and diamond.

17. The quantum computing device of claim 1, wherein the at least one conductive surface is a superconducting material.

18. The quantum computing device of claim 1, wherein the at least one dimension includes a depth of a recess formed in a second substrate of the second chip.

19. A quantum computing device, comprising:
a first chip having one or more qubits, each of the one or more qubits having a corresponding associated resonance frequency; and
a second chip having at least one conductive surface, the at least one conductive surface defining an opening through the at least one conductive surface exposing a recess, wherein a depth of the recess corresponds to a resonance frequency associated with at least one of the one or more qubits.

20. A quantum computing system, comprising:
a quantum computing device, the quantum computing device comprising:
a first chip having one or more qubits, each of the one or more qubits having a corresponding associated resonance frequency; and
a second chip having at least one conductive surface, the second chip having a recess formed therein that extends through an opening in the at least one conductive surface at least to the second substrate, wherein the at least one conductive surface has at least one dimension configured to adjust the resonance frequency associated with at least one of the one or more qubits.

* * * * *